United States Patent
Floryan et al.

[11] Patent Number: 6,040,000
[45] Date of Patent: Mar. 21, 2000

[54] METHOD AND APPARATUS FOR A MICROCHANNEL PLATE HAVING A FISSURED COATING

[75] Inventors: Richard F. Floryan, Roanoke; George Hambro, Blue Ridge, both of Va.

[73] Assignee: ITT Manufacturing Enterprises, Inc., Wilmington, Del.

[21] Appl. No.: 09/047,167

[22] Filed: Mar. 24, 1998

[51] Int. Cl.[7] ................................... C23C 14/24
[52] U.S. Cl. .................. 427/78; 427/126.1; 427/255.11; 427/255.23; 427/259; 427/272
[58] Field of Search .................. 427/78, 126.1, 427/248.1, 255.1, 255, 255.11, 255.23, 259, 272

[56] References Cited

U.S. PATENT DOCUMENTS

| | | | |
|---|---|---|---|
| 4,051,403 | 9/1977 | Feingold et al. | 313/105 |
| 5,029,963 | 7/1991 | Naselli et al. | 350/96.18 |
| 5,084,780 | 1/1992 | Phillips | 359/350 |
| 5,624,706 | 4/1997 | Goukassian | 427/77 |

Primary Examiner—Timothy Meeks
Attorney, Agent, or Firm—McDermott, Will & Emery

[57] ABSTRACT

There is disclosed in a microchannel plate for an image intensifier tube, a fissured material capable of secondary electron emission disposed on a top surface of the microchannel plate. The fissured material has randomized fissures which permit electrons impinging on the material to exhibit increased electron emission along each of the fissures. The fissured material operates as an electron multiplier causing a cascade of electrons for entry into the MCP channels in response to an electron entering a respective one of the fissures. The image intensifier tube includes an evacuated housing with a photo cathode disposed at a first end thereof, and an optic element disposed at a second end thereof. The microchannel plate with the fissured coating on the top surface is disposed in the evacuated housing between the photo cathode and the optic element. There is also disclosed the method of depositing the fissured material onto the microchannel plate comprises placing the MCP in a vacuum, placing the material in a vessel within the vacuum, introducing an inert gas into the vacuum, and evaporating the material onto the surface of the MCP by heating the material to the vapor point, so as to cause the material to be deposited in the fissured configuration.

10 Claims, 6 Drawing Sheets

METHOD AND APPARATUS FOR A MICROCHANNEL PLATE HAVING A FISSURED COATING

FIELD OF THE INVENTION

The invention relates generally to microchannel plates used in image intensifier tubes and more particularly, to a microchannel plate on which is formed a fissured material for providing secondary electron emission incident to the microchannel plate for providing enhanced electron gain and ion barrier protection to the photo cathode.

BACKGROUND OF THE INVENTION

A microchannel plate is a key component of an image intensifier tube. Image intensifier tubes are employed for the purpose of amplifying a low intensity or non-visible radiational image of an object into a readily viewable image. Many industrial and military applications exist for such devices including enhancing the night vision of aviators, rendering night vision to persons who suffer from retinitis pigmentosa, more commonly known as night blindness and photographing astronomical bodies.

The general construction of a prior art image intensifier tube is exemplified in FIG. 1 which illustrates a Generation III (Gen III) image intensifier tube 10. Examples of GEN III image intensifier tubes can be found in U.S. Pat. No. 5,029,963 to Naselli, et al., entitled REPLACEMENT DEVICE FOR A DRIVER'S VIEWER and U.S. Pat. 5,084,780 to Phillips, entitled TELESCOPIC SIGHT FOR DAYLIGHT VIEWING both of which are manufactured by ITT Corporation, the assignee herein.

The GEN III image intensifier tube 10 shown in FIG. 1 comprises an evacuated envelope or vacuum housing 22 having a photo cathode 12 disposed at one end of the housing 22 and a phosphor screen 30 disposed at the other end of the housing 22. A microchannel plate (MCP) 24 is positioned within the vacuum housing 22 between the photo cathode 12 and the phosphor screen 30.

The photo cathode comprises a glass faceplate 14 coated on one side with an antiflection layer 16; a gallium aluminum arsenide (GaAlAs) window layer 17; a gallium arsenide (GaAs) active layer 18; and a negative electron affinity (NEA) coating 20.

The MCP 24 is located within the vacuum housing 22 and is separated from the photo cathode 12 by gap 34. An MCP is an electron multiplier formed by an array of microscopic channel electron multipliers. The MCP 24 is generally made from a thin wafer of glass having an array of microscopic channels extending between input and output surfaces 26 and 28 respectively. The wall of each channel is formed of a secondary emitting material. The phosphor screen 30 is located on a fiber optic element 31 and is separated from the output surface 28 of the MCP 24 by gap 36. The phosphor screen 30 generally includes aluminum overcoat 32 to stop light reflecting from the phosphor screen 30 from re-entering the device through the NEA coating 20.

In operation, infrared energy coming from an external object impinges upon the photo cathode 12 and is absorbed in the GaAs active layer 18, resulting in the generation of electron/hole pairs. The electrons generated by the photo cathode 12 are subsequently emitted into gap 34 of the vacuum housing 22 from the NEA coating 20 on the GaAs active layer 18. The electrons emitted by the photo cathode 12 are accelerated toward the input surface 26 of the MCP 24 by applying a potential applied across the input surface 26 of the MCP 24 and the photo cathode 12 of approximately 800 volts.

When an electron enters one of the channels of the MCP 24 at the input surface 26, a cascade of secondary electrons is produced from the channel wall by secondary emission. The cascade of secondary electrons are emitted from the channel at the output surface 28 of the MCP 24 and are accelerated across gap 36 toward the phosphor screen 30 to produce an intensified image. Each microscopic channel functions as a secondary emission electron multiplier having an electron gain of approximately several hundred. The electron gain is primarily controlled by applying a potential difference across the input and output surfaces of the MCP 24 of about 900 volts.

Electrons exiting the MCP 24 are accelerated across gap 36 toward the phosphor screen 30 by the potential difference applied between the output surface 28 of the MCP 24 and the phosphor screen 30. This potential difference is approximately 6000 volts. As the exiting electrons impinge upon the phosphor screen 30, many photons are produced per electron. The photons create an intensified output image on the output surface of the optical inverter or fiber optics element 31.

The image reproducing effectiveness of prior art MCPs depends in part on the ability of the cascading electrons coming from each channel of the MCP 24, to reach the phosphor screen 30 before any significant spatial dispersion occurs. If the cascading electrons spatially disperse before reaching the phosphor screen 30, the resolution of the intensified image will become degraded.

An additional problem results from the absorption of electrons impinging on the MCP surface from the photocathode. Referring again to FIG. 1, channels comprise approximately 60% of the top surface area of the MCP. Accordingly, the remaining 40% of the top surface of the MCP comprises a solid layer of glass which absorbs electrons incident from the photocathode. Therefore, approximately 40% of the electrons emitted from the photocathode are lost upon reaching the MCP.

The process of deposition of fissured material has been used in the manufacture of electron multipliers for use in particle counters and photo multipliers. Such devices are made by incorporating secondary emitting materials onto a wire mesh for supporting the device, and applying an electric field across the fissured material. In this manner, incoming particles or electrons are multiplied by producing secondary electrons which cascade through the fissures in the material in a manner similar to the channels of a microchannel plate. However, such an electron multiplier as described, while useful in non-imaging devices such as particle counters, could not be used in an image intensifier system because of the need for a mesh or similar supporting structure placed adjacent the MCP. Such a mesh would project onto the phosphor screen, and thus obfuscate the purpose of an image intensifier. Furthermore, a device of this type with sufficient thickness to provide the required electron gain is likely to have poor spatial resolution as well as poor modulation transfer function (MTF) performance as a result of lateral electron spreading during the multiplication process.

Other applications have used a solid material having secondary emission characteristics as an overcoat disposed on the MCP webbing or mesh, and that penetrated some distance into the MCP channel. While such a coating may provide first strike secondary emission for incoming electrons or particles, such devices fail to provide any cascade gain. Moreover, such coating does not serve as an ion barrier for blocking ions generated as a result of secondary emission and which travel back up the channel toward the photo cathode with potentially damaging effects.

Accordingly, it is desirable to obtain a device which provides secondary emission of particles or electrons incident to an MCP, resulting in a greater cascade gain and which acts as an ion barrier for protecting a photo cathode while providing proper spatial resolution for imaging.

SUMMARY OF THE INVENTION

It is an object of the invention to provide in an image intensifier a fissured secondary emitting material to the input surface of a microchannel plate as a thin overcoat to the MCP. The MCP acts as the supporting structure and thus eliminates the problem of imaging the supporting structure. This enables the fissured material layer to be very thin in order to reduce or eliminate the electron spreading. The coating layer of fissured material completely covers the MCP including the channel openings, wherein the fissured structure permits the cascaded electron multiplication in order to provide incoming photo electrons a very high first strike gain. In this manner signal to noise ratio is improved. The device also provides a higher probability of an incoming photoelectron producing a detected signal, further improving the signal to noise ratio. Moreover, the fissured structure of the secondary emitting material serves to replace the function of the existing ion barrier film located on the MCP. This prevents gas ions from reaching the photo cathode of an image intensifier and degrading its performance. Preferably, the fissured material may be made of a material including CsI or MgO.

It is also an object of the present invention to describe a method for depositing the fissured secondary emission material onto the MCP. The MCP is placed in a vacuum with an evaporation vessel containing the fissured material to be evaporated. The system is evacuated and then filled with an inert gas. The material is then evaporated onto the surface of the MCP by heating it to the vapor point of the material. This is accomplished by passing a current through the evaporation vessel. The gas pressure thereby causes the material to be deposited in a fissured configuration, necessary for use as the secondary emitting coating.

DETAILED DESCRIPTION OF THE INVENTION

Figure 1:
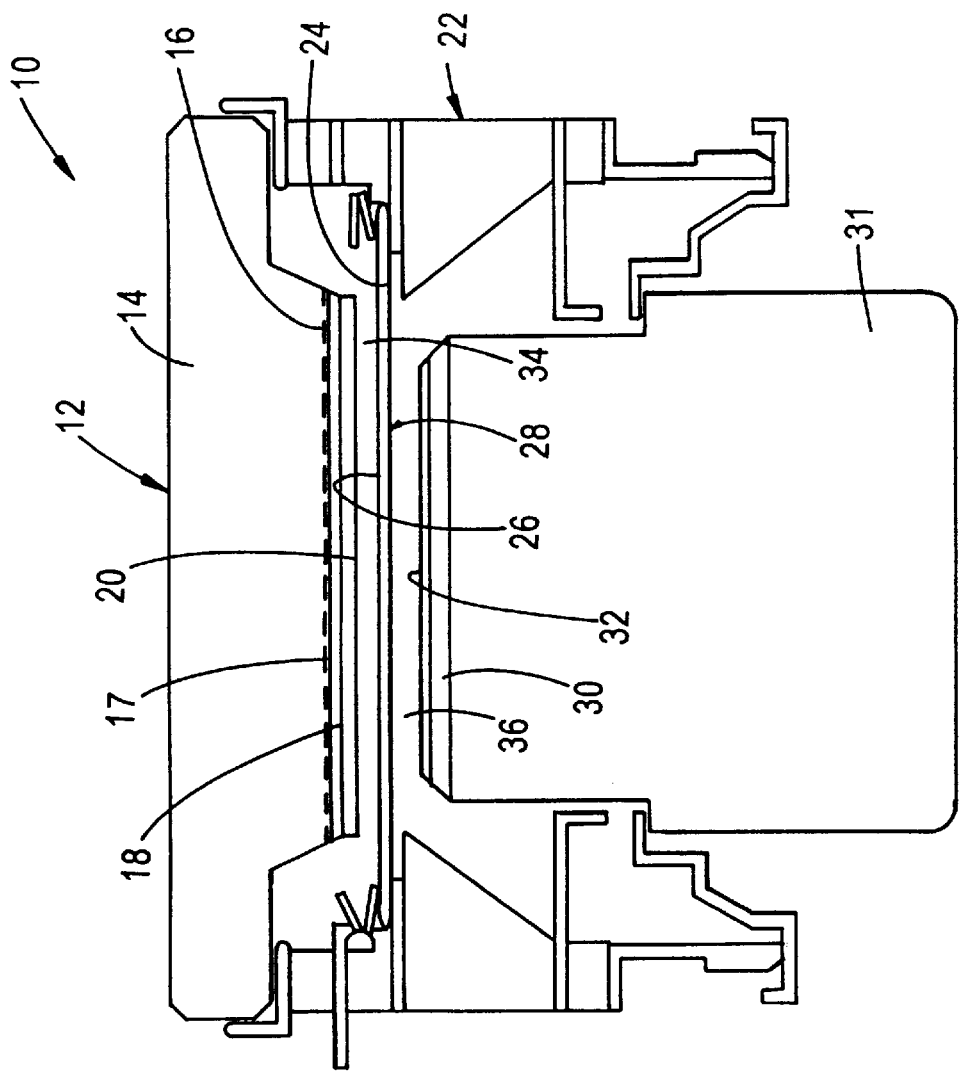
FIG. 1 is a prior art view of an image intensifier tube.
Figure 2:
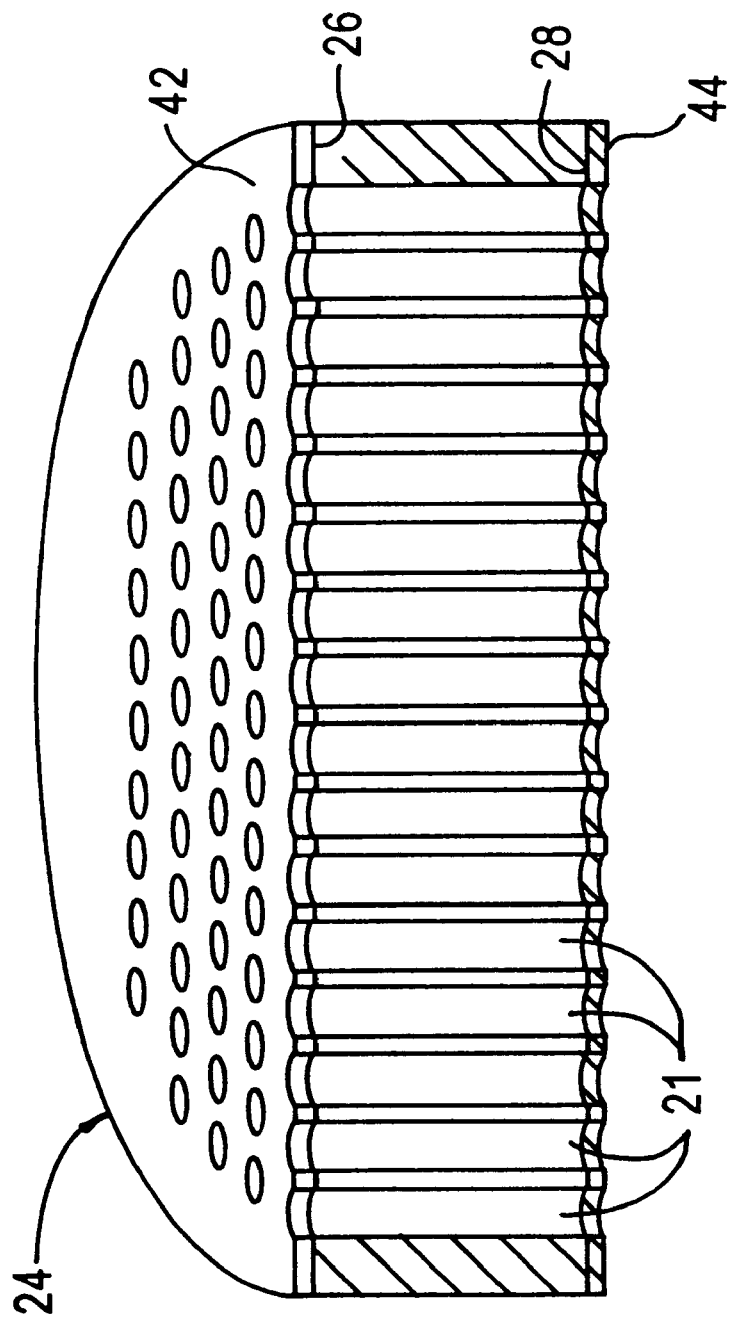
FIG. 2 is a prior art cross-section of the MCP of FIG. 1.

Referring now to FIG. 2, there is shown a cross-sectional view of the MCP 24 used in the image intensifier tube of FIG. 1. In reference to the drawings, like parts are indicated by like reference numerals. The MCP 24 is fabricated from a thin wafer of glass having an array of microscopic channels 21 extending between input and output surfaces 26 and 28 respectively. The wall of each channel is formed of a secondary emitting material. As can be seen, input and output surfaces 26 and 28 are made conductive by providing metal electrodes 42 and 44. The electrodes are provided so that electron gain can be controlled by applying a potential difference across the input and output surfaces of the MCP. The input and output electrodes 42 and 44 of the MCP are formed on respective input and output surfaces 26 and 28 by deposition of a thin metallization layer.

As earlier mentioned, when an electron enters a channel in an MCP, a cascade of secondary electrons are produced from the channel wall by secondary emission. This is made possible by making the wall of the channel emissive. When an electron impinges on the channel wall, secondary electrons are emitted in response thereto. The metal electrodes allow a potential difference to be applied across the input and output of each channel. The potential difference generates an electrostatic field which accelerates the cascade of emitted secondary electrons down the channel 21. Each time one of the secondary electrons strikes the wall of the channel it causes additional secondary electrons to be emitted. This sequence continues over and over again as the electrons are accelerated down the channel and produces an amplification of the primary electron. Accordingly, a large pulse of electrons is emitted from the output end of the channel as a result of the input of the primary electron.

As previously mentioned however, only those electrons which enter a channel in the MCP are capable of providing the cascade of secondary electrons produced through secondary emission within the channel wall. Approximately 40% of the electrons impinging onto the MCP are absorbed at the top surface of the MCP and do not enter any of the channels.

Figure 3:
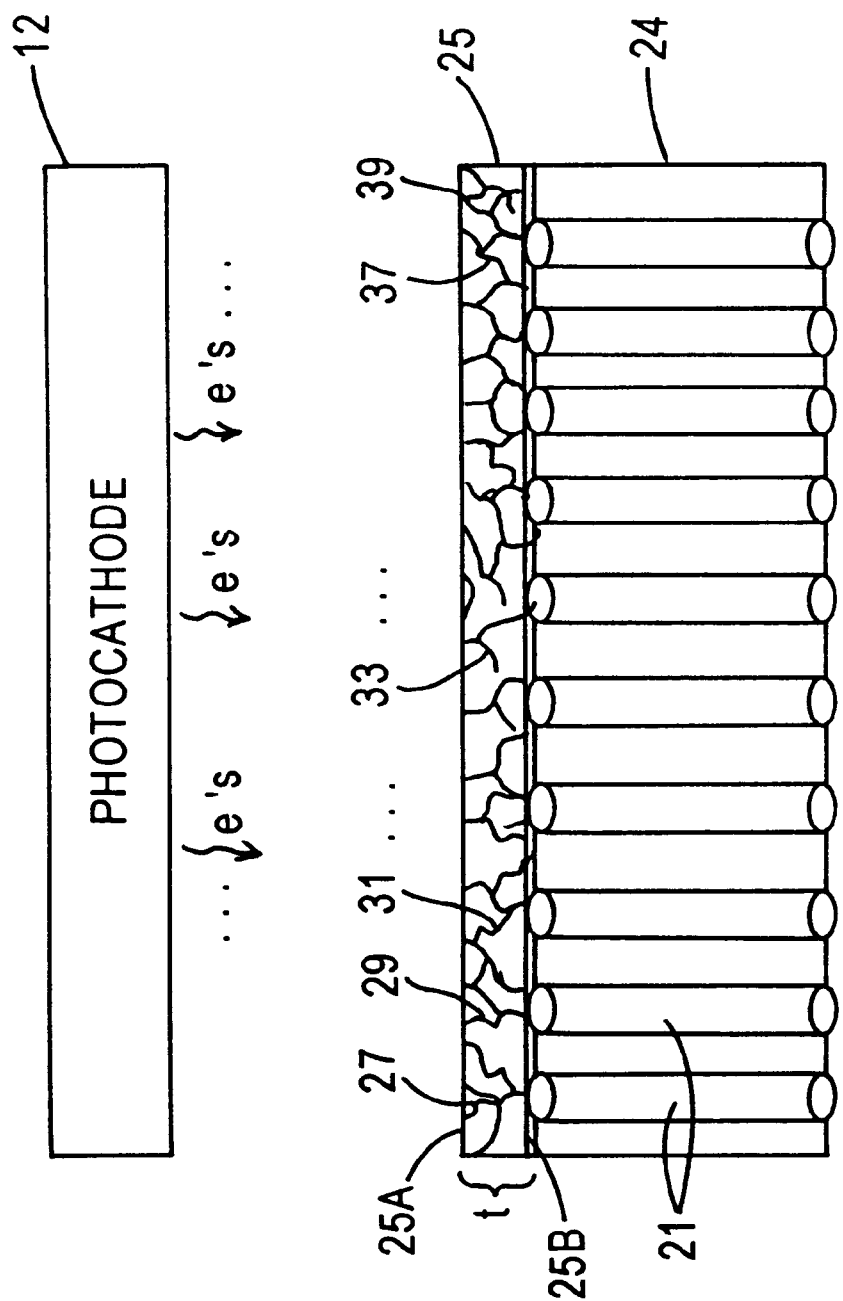
FIG. 3 is an illustration of an MCP having a fissured coating in accordance with the present invention.

Referring now to FIG. 3, there is shown a cross-sectional view of an MCP including a fissured material 25 deposited on the top surface of the MCP according to the present invention. The material 25 contains a plurality of fissures (27, 29 . . . 39 ) or random cracks extending from the top surface 25A through to the bottom surface 25B of the material 25. These fissures permit electrons exiting the photo cathode 12 to enter the fissured material 25 and to emit secondary electrons from a primary electron entering and proceeding down through a particular fissure.

In the preferred embodiment, the fissured material 25 is of a secondary emitting material such as cesium iodine (CsI). Alternatively, the layer 25 may be a layer of magnesium oxide (MgO). The fissured material, by means of its randomized fissures permits electrons impinging on the top surface 25a to exit at the bottom surface. The fissured material 25 thus operates as an electron multiplier to cause a cascade of electrons in response to a single electron entering a respective fissure. In the preferred embodiment, the material 25 has a thickness t of approximately the width of a given MCP channel 21 and is approximately 4–6 um thick. As a result, electron spreading is reduced and increase the probability that electrons emitted from fissured coating 25 enter one of the MCP channels 21.

In the preferred embodiment, layer 25 is deposited so as to completely cover the top surface of the MCP, as shown in FIG. 3. In this manner, electrons emitted from the photo cathode strike fissured material 25 and produce secondary electrons which migrate through the fissured material and exit at bottom surface 25B. The high gain electrons resulting from this secondary emission provide a higher probability of electrons entering any one of the MCP channels 21. As a result of the thin overcoat 25 being applied to MCP 24, incoming photo electrons are provided a very high first strike gain, thus improving the signal to noise ratio. Furthermore, the use of the fissured overcoat layer in conjunction with the MCP provides a higher probability of an incoming photo electron producing a detected signal. This further improves the signal to noise ratio.

Figure 4A:
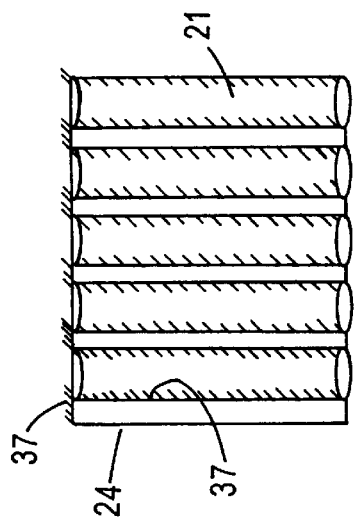
FIGS. 4A–4D illustrate various stages of providing the MCP with fissured coating according to the present invention.
Figure 4B:
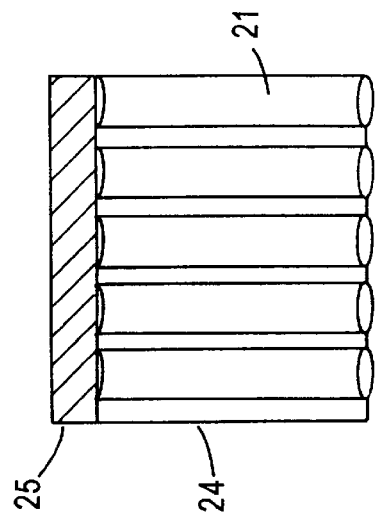
Figure 4C:
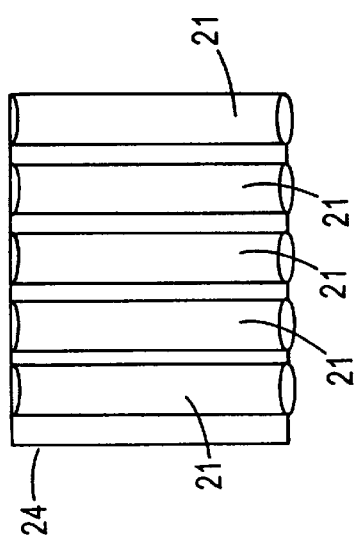
Figure 4D:
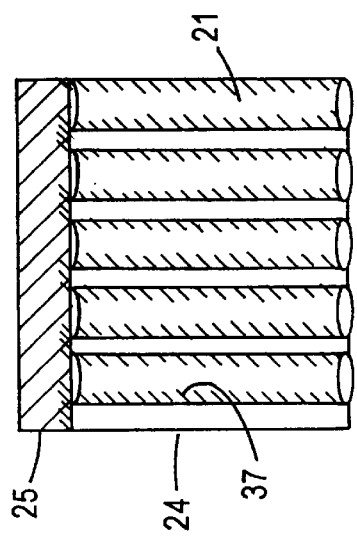

Fissured material 25 also operates as an ion barrier, thereby eliminating the need for insulating films previously used to protect the photo cathode. As is well known, the photo cathode is susceptible to being bombarded by positive ions returning from the MCP. This degrades the performance of the photo cathode. Generally, prior art image intensifiers utilize an additional insulating film disposed between the MCP and the photo cathode to protect the photo cathode and maintain its performance capabilities. Insulating film such as aluminum oxide have been used to coat the surface of the MCP to limit performance degradation. However, fissured material 25, because of its random series of cracks, eliminates the possibility for ions to travel back through the fissures and reach the photo cathode. As a result, the use of an additional insulation fin between the MCP and cathode is no longer necessary. The fissured secondary emitting material 25 rests on and is structurally supported by the input surface of the MCP 24. The MCP, by acting as the supporting structure to layer 25, eliminates the prior art problem of imaging the supporting structure and permits the layer 25 to be very thin. It should be noted that, while the overcoat layer 25 completely covers the MCP input including the channel openings, in the preferred embodiment a thin film 37 of lacquer is first placed over the channel areas and associated channel walls prior to depositing the fissured secondary emitting material 25. FIGS. 4A–D show the various stages involved in providing the MCP with the secondary emitting fissured material 25. The lacquer film 37 is deposited over the MCP and within channel walls 21 via conventional deposition techniques, as shown in FIG. 4B. Fissured secondary emitting material 25 is then evaporated onto the MCP 24, as shown in FIG. 4C. After deposition of material 25, the lacquer film is removed using conventional etching techniques. The resulting structure is shown in FIG. 4D. In this manner, secondary emission emitting material 25 is suspended over MCP 24 but does not penetrate into the associated channels 21.

Figure 5:
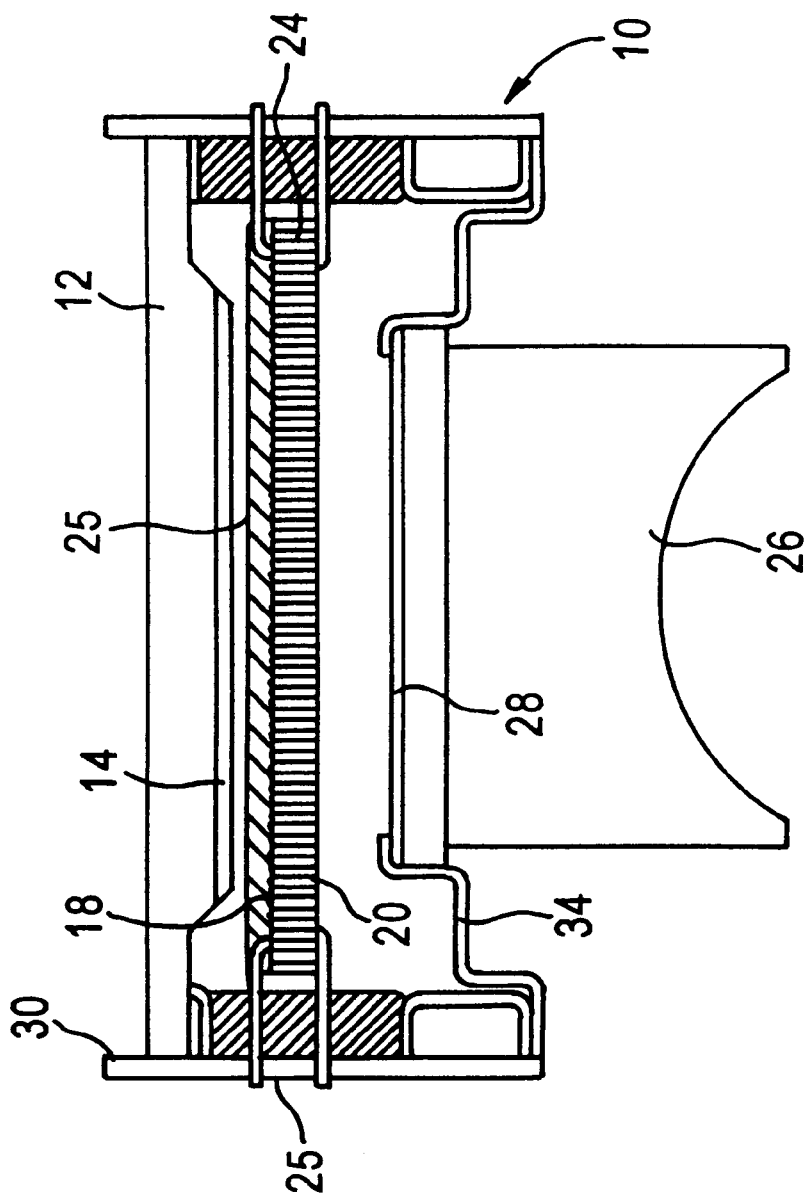
FIG. 5 is an illustration of an image intensifier incorporating the MCP with fissured coating according to the present invention.

Referring now to FIG. 5, the present invention image intensifier tube 10 including an MCP with a fissured coating is shown. The tube 10 includes an input window 12 having a photo-emissive wafer 14 which together function as a cathode.

Referring back to FIG. 5, positioned adjacent to the input window 12 is a microchannel plate (MCP) 24 having an input face 18 and an output 20 face. The input 18 face is coated with fissured secondary emitting material 25 such as CsI or MgO. Coating 25 is essentially grounded due to the internal structure of the tube 10. Preferably, the coating 25 is approximately 4–6 um thick corresponding to the diameter of channels 21. The MCP 24 is fabricated from a glass material and has channels 21 which operate to multiply the number of electrons impinging on it, resulting in the emission of secondary electrons which in turn causes the emission of more secondary electrons.

Positioned adjacent to the MCP 24 is an output window 26 having a phosphor screen 28 which together function as an anode. Electrons impinging on the phosphor screen 28 cause the screen to fluoresce.

The photo cathode, fissured secondary coating 25, MCP 24, and the output window 26 are contained in an evacuated housing 25. The input window 12 is sealed within the housing 25 and is surrounded by a flange 30. The flange 30 supports the input window 12 within the housing. A retainer ring 34 seals an end of the tube 10 and supports the output window 26 within the housing 25. The seals provided at the input window 12 and the retainer ring 34 maintain evacuated conditions in the housing 25.

Power is supplied to the photo emissive wafer, the MCP 24 and the phosphor screen 28 by means integral with or external to the housing 25. The previously described electron multiplication or gain within the MCP 24 is essentially controlled by the potential difference applied across the input 18 and output 20 surfaces of the MCP 24.

In operation, a radiation image impinges on the input window 12. The input window 12 receives and transmits light. Light rays penetrate the input window 12 and are directed to the photo emissive wafer 14 which transforms photons of light into electrons. This causes the emission of electrons which are attracted to the MCP 24 which is maintained at a higher positive potential than the photo cathode. The electrons from the photo cathode first strike and penetrate the random fissures of coating 25, causing secondary emission of electrons onto MCP 24. The secondary electrons emanating from material 25 are received by the input plane 18 of the MCP 24. The MCP 24 then multiplies the number of electrons received from the photo emissive wafer 14 as previously described. The electrons emanating from the MCP 24, which contain information from the input radiation image, impinge on the phosphor screen 28 causing the phosphor screen 28 to fluoresce and reproduce the input image.

In an alternative embodiment, electrodes may be placed on the top and bottom surfaces respectively of the fissured material to cause a potential difference therebetween. In this manner, an electric field is created between the top and bottom surface of the material 25. This causes greater acceleration of the electrons through the fissures and increased secondary emission, occurring prior to contact with the MCP 24.

Figure 6:
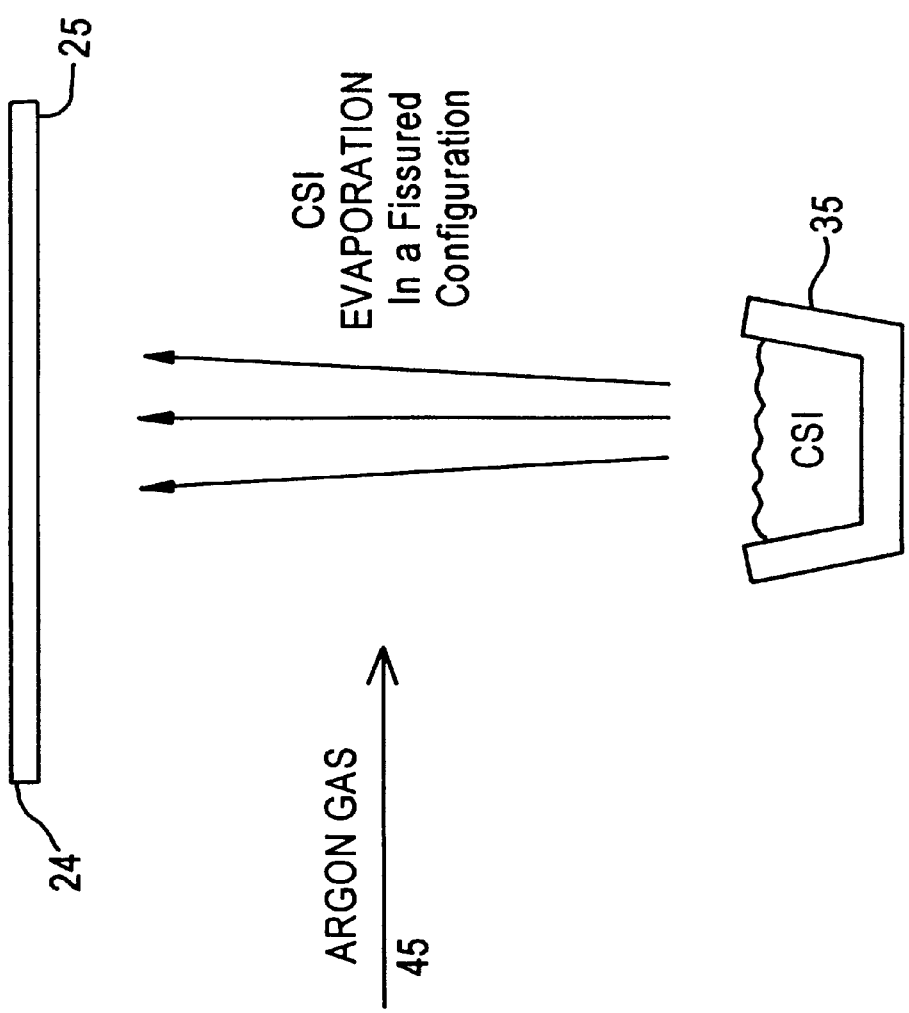
FIG. 6 is a schematic diagram of a method of applying the fissured coating to the MCP in accordance with the present invention.

Referring now to FIG. 6, a method for depositing the fissured secondary emitting material according to the present invention is described. The MCP 24 is placed in a vacuum system which is fitted with an evaporation vessel 35 containing the secondary emitting material CsI to be evaporated. The system is then evacuated and an inert gas 45 is then introduced into the system. In the preferred embodiment, the inert gas is argon. The material 25 is then evaporated onto the surface of the MCP by passing a current through the evaporation vessel. This heats the material to the vapor point as is standard for evaporation of a material onto a surface. However, the presence of the argon gas causes the material to be deposited in a fissure configuration. In this manner, the material (e.g. CsI or MgO) is operable for use as the secondary emitting coating.

It will be understood that a person skilled in the art may make many variations and modifications without departing from the spirit and the scope of the invention. All such modifications are intended to be included within the scope of the invention as defined in the appended claims.

What is claimed is:

1. A method for making an improved microchannel plate, comprising:

providing a microchannel plate being of a type formed from a substrate having an input surface, and output surface, and a plurality of channels extending therebetween for providing secondary emmission of electrons incident to said channels;

forming an insulative film over the input surface and the channels of the microchannel plate;

after forming the insulative film, depositing a fissured material onto the input surface of the microchannel plate, said fissured material having random fissures and being capable of secondary electron emission on the input surface of the microchannel plate and of causing a cascade of electrons for entry into said channels of the microchannel plate in response to an electron entering one of said fissures; and after depositing the fissured material, removing the insulative film, whereby said fissured material does not penetrate into the channels.

2. The method according to claim 1, wherein the step of depositing said fissured material further comprises:

a) placing said microchannel plate in a vacuum system;

b) placing said a deposition material in a vessel within said vacuum system;

c) evacuating said vacuum system;

d) providing an inert gas into said evacuated vacuum system;

e) evaporating said deposition material onto the input surface of the microchannel plate, thereby providing said fissured material.

3. The method according to claim 2, wherein the step of evaporating further comprises heating said material to the vapor point to cause said material to be deposited in said fissured configuration.

4. The method according to claim 3, wherein the step of heating comprises passing a current through said vessel.

5. The method according to claim 2, wherein said inert gas comprises argon.

6. The method according to claim 1, wherein the thickness of said fissured material is between 4–6 $\mu$m.

7. The method according to claim 1, wherein said fissured material is operable as an ion barrier.

8. The method according to claim 1, wherein said fissured material comprises cesium iodine (CsI).

9. The method according to claim 1, wherein said fissured material comprises magnesium oxide (MgO).

10. The method according to claim 1, wherein said fissured material completely covers the input surface of said microchannel plate including said channels.

* * * * *